United States Patent [19]

Zocher

[11] Patent Number: 5,670,912
[45] Date of Patent: Sep. 23, 1997

[54] VARIABLE SUPPLY BIASING METHOD AND APPARATUS FOR AN AMPLIFIER

[75] Inventor: Andrew Gerald Zocher, Spring Grove, Ill.

[73] Assignee: Motorola, Inc., Schaumburg, Ill.

[21] Appl. No.: 594,926

[22] Filed: Jan. 31, 1996

[51] Int. Cl.[6] .................................................. H03F 3/19
[52] U.S. Cl. ............................................. 330/296; 455/127
[58] Field of Search ............................... 330/202, 204, 330/267, 273, 285, 296, 297; 455/89, 95, 127

[56] References Cited

U.S. PATENT DOCUMENTS

| | | |
|---|---|---|
| 4,320,350 | 3/1982 | Drapac .................. 330/297 X |
| 4,439,743 | 3/1984 | Schwarz et al. . |
| 4,525,663 | 6/1985 | Henry . |
| 4,547,746 | 10/1985 | Erickson et al. . |
| 4,760,347 | 7/1988 | Li et al. . |
| 4,972,158 | 11/1990 | Sutterlin . |
| 5,043,872 | 8/1991 | Youn . |
| 5,196,807 | 3/1993 | Fujisawa . |
| 5,204,637 | 4/1993 | Trinh . |
| 5,223,751 | 6/1993 | Simmons et al. . |
| 5,311,143 | 5/1994 | Soliday . |
| 5,373,227 | 12/1994 | Keeth . |
| 5,442,322 | 8/1995 | Kornfield et al. . |

OTHER PUBLICATIONS

Mixing 3-V and 5-V ICs, by John Williams, Intel Corp., *IEEE Spectrum*, Mar. 1993, pp. 40–42.

ICs Going On a 3-V Diet, by Betty Prince, Texas Instruments, Inc., and Roelof H.W. Salters, Philips Research Laboratories, *IEEE Spectrum*, May 1992, pp. 22–25.

BiCMOS Process Offers Power, Performance and Cost Advantages, by Michael M. Sera and Bill Mack, Philips Semiconductors, *RF Featured Technology*, Aug. 1994, pp. 30–34.

*Primary Examiner*—James B. Mullins
*Attorney, Agent, or Firm*—John G. Rauch; John J. Oskorep

[57] ABSTRACT

An electronic circuit (412) comprises a biasing circuit (414) and an amplifier (416). Biasing circuit (414) biases amplifier (416) with a first current when a supply voltage of electronic circuit (412) is within a predetermined voltage range corresponding to a first supply voltage, and biases amplifier (416) with a second current when the supply voltage is within a predetermined voltage range corresponding to a second supply voltage. The first current and the second current provide separate operating points for amplifier (416), operating points which may, upon design, provide substantially the same operating characteristics. The operating points change with the supply voltage in order to minimize power dissipation. Electronic circuit (412) is suitable for use in an integrated circuit, where it can be used in various electronic systems which provide different supply voltages or have a potential for using lower-voltage technology in the future.

23 Claims, 6 Drawing Sheets

— PRIOR ART —

— PRIOR ART —

VARIABLE SUPPLY BIASING METHOD AND APPARATUS FOR AN AMPLIFIER

FIELD OF THE INVENTION

The present invention relates generally to the field of amplifiers, and more particularly to the field of amplifier biasing.

BACKGROUND OF THE INVENTION

Ever-present demands for faster and more efficient data processing techniques have prompted a significant development effort in the area of low-voltage integrated circuits (hereinafter "LVICs"). Currently, ICs which operate at a nominal supply voltage of 3.3 V are gradually replacing standard ICs which operate at a nominal supply voltage of 5 V due to their improved speed, lower power consumption, and higher integration densities. Many products are taking advantage of the latest LVIC efforts, including portable computers and communication devices such as cellular telephones.

A good deal of LVICs presently operate from 3.3 V power supplies. Embedded controllers, memories, and a variety of logic chips are widely available in this form. However, only 5 V ICs are currently available for some peripheral components. Due to this unfinished LVIC transition, a product developer who wishes to utilize LVICs in an electronic system of a product may be faced with several difficulties in implementing a mixed-voltage design.

In time, however, a complete set of 3.3 V ICs will be available. But 3.3 V ICs are only a transitional stage to ICs with even lower voltages that will not only further improve the speed and reduce the power consumption of ICs, but also will enable a direct, single-cell battery operation. It is expected that next generations of ICs will require voltages in the 1 V–3 V range.

A common component in electronic systems, including electronic systems which may utilize LVICs, is an amplifier. An amplifier is typically biased at a supply voltage of a system, or at a reference voltage based on the supply voltage. FIG. 1 shows a conventional radio frequency (RF) amplifier 100 biased at a supply voltage $V_{CC}$ and a current $I_C$. When $V_{CC}$=5 V, conventional RF amplifier 100 operates at an operating point $Q_1$ and along a load line 200 as shown in FIG. 2. In this example, operating point $Q_1$ biases conventional RF amplifier 100 for class A (or AB) operation having a linear operating characteristic which is required, for example, in a driver amplifier of a digital transmitter of a communication device.

If conventional RF amplifier 100 is placed in a low-voltage system where Vcc is dropped from 5 V to 3.3 V, conventional RF amplifier 100 is then biased at operating point $Q_2$ and along a load line 202. Unfortunately, operating point Q2 biases conventional RF amplifier 100 in a region which may no longer exhibit the same linear operating characteristics necessary for use in the digital transmitter. This problem can be eliminated by choosing a larger value of Ic initially such that, when $V_{CC}$=3.3 V, conventional RF amplifier 100 remains biased with the same linear operating characteristic at an operating point $Q_3$ and along a load line 204. Linearity is achieved by the increase in current $I_C$ and through a modification of a load of conventional RF amplifier 100, and is shown by a greater negative slope of load line 204. Now if conventional RF amplifier 100, as biased, is placed in a higher-voltage system where $V_{CC}$=5 V, conventional RF amplifier 100 is biased at operating point $Q_4$ and along a load line 206. Unfortunately, although the necessary linear operating characteristic is maintained in the increase of $V_{CC}$ to 5 V, conventional RF amplifier 100 now dissipates substantially more power than when biased at operating point $Q_1$.

There is a resulting need for a proper and efficient way to bias an amplifier for use in electronic systems which provide different supply voltages.

DETAILED DESCRIPTION OF THE PREFERRED EMBODIMENT

According to the present invention, an electronic circuit comprises a biasing circuit and an amplifier. The biasing circuit biases the amplifier with a first current when a supply voltage of the electronic circuit is within a predetermined voltage range corresponding to a first supply voltage, and biases the amplifier with a second current when the supply voltage is within a predetermined voltage range corresponding to a second supply voltage. The first current and the second current provide separate operating points for the amplifier, operating points which may, upon design, provide substantially the same operating characteristics. The operating points change with the supply voltage in order to minimize power dissipation. The electronic circuit is suitable for use in an integrated circuit, where it can be used in various electronic systems which provide different supply voltages. Such an IC also provides flexibility for an electronic system which has a potential for using lower-voltage technology in the future, such as an electronic system used in a communication device.

Figure 1:
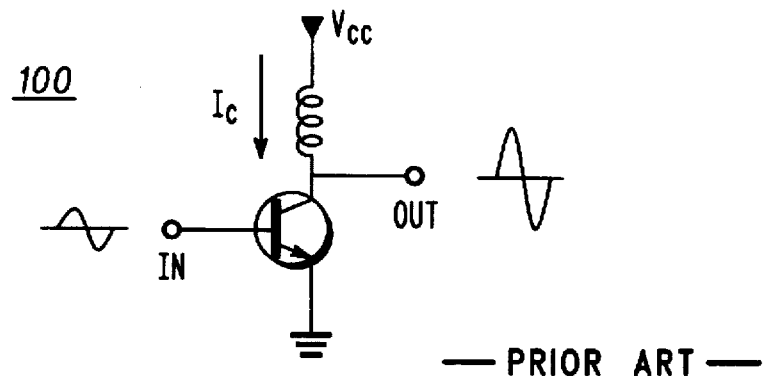
FIG. 1 is a schematic diagram of conventional RF amplifier 100.
Figure 2:
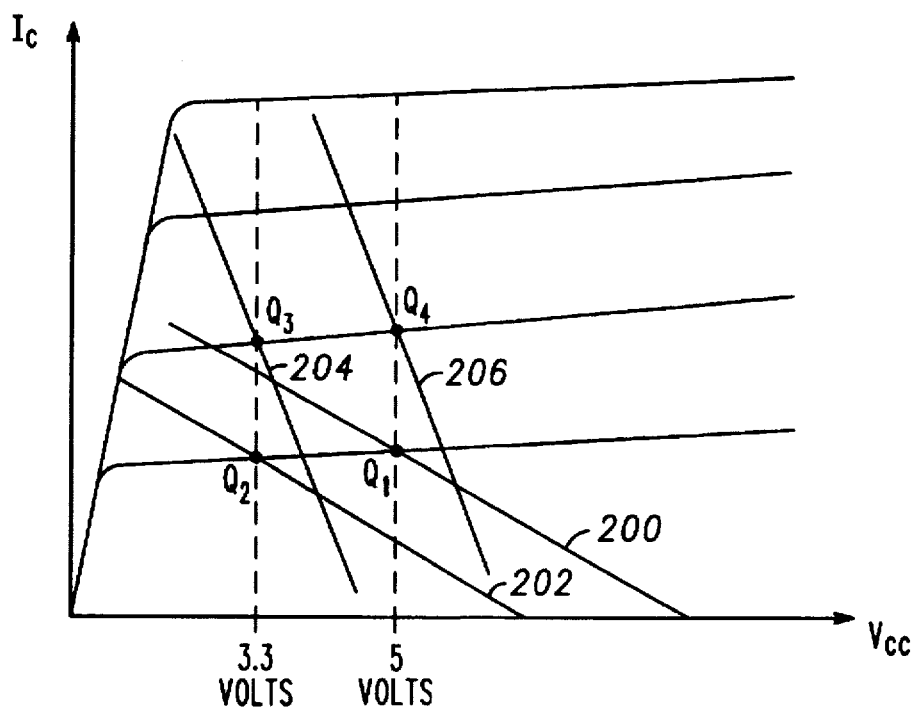
FIG. 2 is a graph showing several operating points of the conventional RF amplifier of FIG. 1 when biased with different supply voltages.
Figure 3:
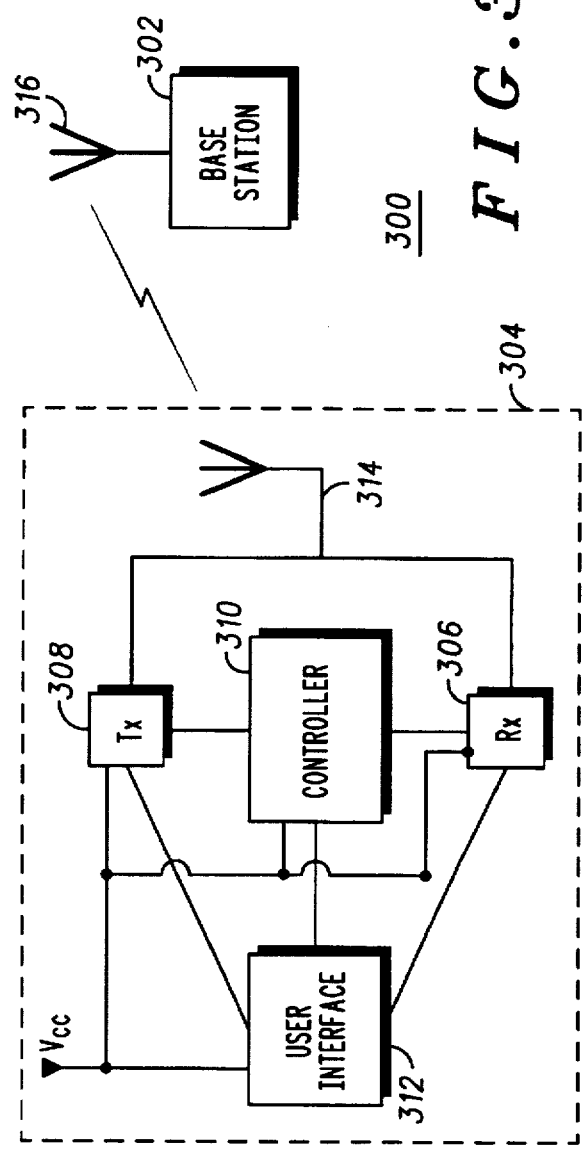
FIG. 3 is a block diagram of a communication system.

FIG. 3 is a block diagram of a communication system 300 with which the present invention may be used. Communication system 300 comprises a base station 302 and a mobile station 304. Mobile station 304, a communication device, includes a receiver 306, a transmitter 308, a controller 310, and a user interface 312, each of which is coupled to and powered from a supply voltage, $V_{CC}$. The supply voltage may be obtained from a battery (not shown) of mobile station 304. Base station 302, another communication device, sends and receives RF signals to and from mobile station 304 through an antenna 316. Mobile station 304 receives the RF signals through an antenna 314 and receiver 306. Controller 310 assists in controlling mobile station 304 based on the RF signals and input signals from user interface 312. Mobile station 304 generates data signals with help from controller 310 and input signals from user interface 312. The data signals are modulated by transmitter 308, and the resultant RF signals are transmitted through antenna 314.

Figure 4:
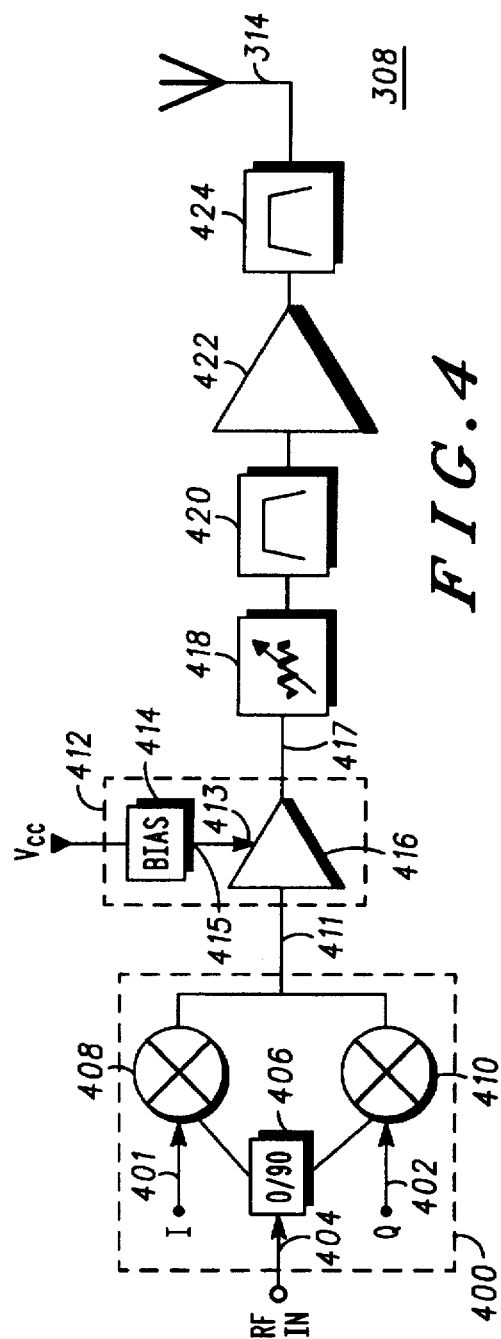
FIG. 4 is a block diagram of a portion of a transmitter of a mobile station shown in FIG. 3.

FIG. 4 is a block diagram of a portion of transmitter 308. In the preferred embodiment, transmitter 308 is a digital transmitter. A quadrature modulator 400 of transmitter 308 comprises a phase shifter 406, a mixer 408, and a mixer 410. An I signal 401 is input to mixer 408 and a Q signal 402 is input to mixer 410. An RF carrier signal is input to phase shifter 406 through an RF carrier input 404. I and Q signals 401 and 402 are mixed with the RF carrier signal which is fed through phase shifter 406. The resultant mixed signals are combined to form an input signal to an amplifier input 411. Amplifier input 411 is coupled to an amplifier 416 of an electronic circuit 412, which further comprises a biasing circuit 414. Biasing circuit 414 has a biasing output 415 coupled to a biasing input 413 of amplifier 416, and biases amplifier 416 with a biasing current. Amplifier 416 amplifies the input signal at a gain N, generating an output signal at amplifier output 417. Amplifier output 417 is input to a variable gain stage 418. The output from variable gain stage 418 is filtered through a filter 420 and amplified through a power amplifier 422. The output from power amplifier 422 is then filtered through a filter 424 and transmitted through antenna 314.

Figure 5:
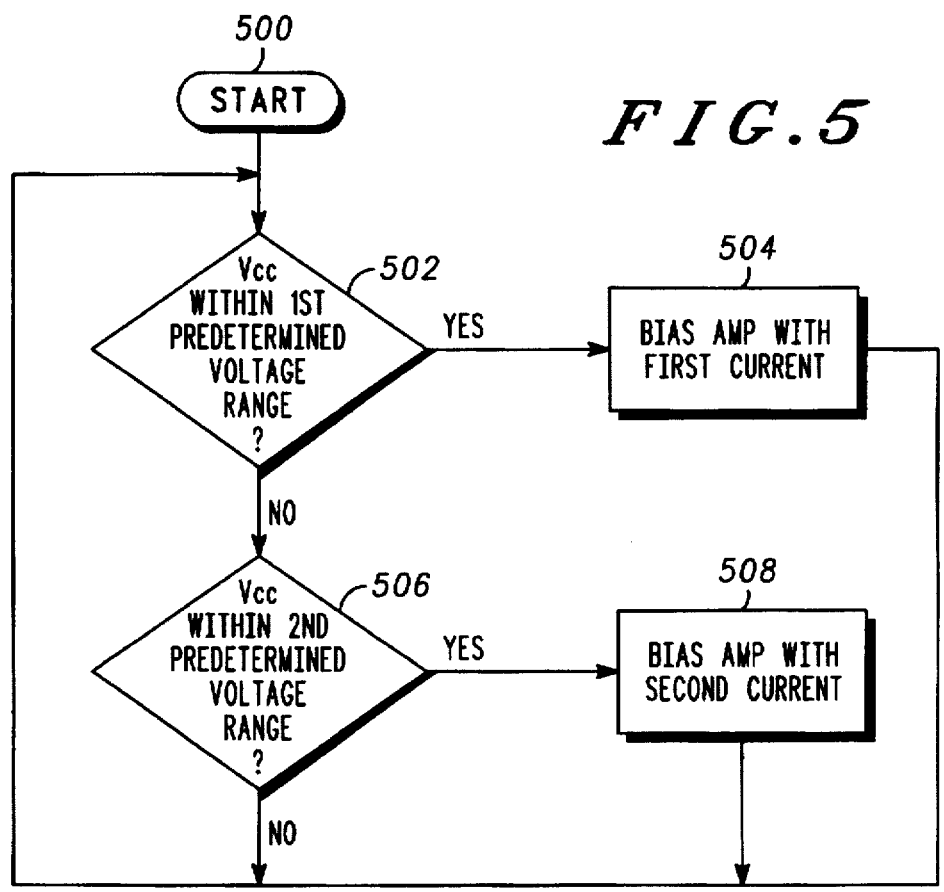
FIG. 5 is a flowchart of a method of biasing an amplifier in accordance with the present invention.
Figure 6:
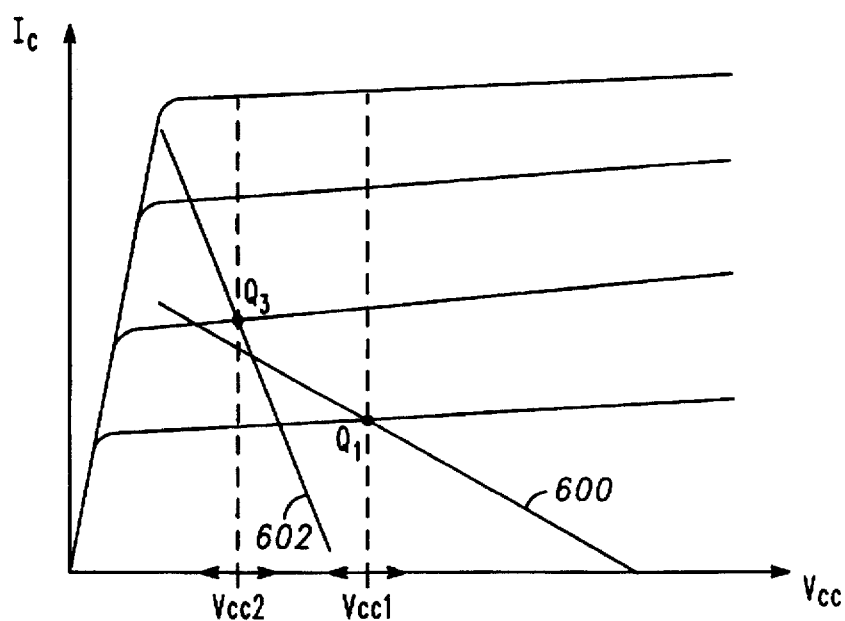
FIG. 6 is a graph which illustrates possible operating points of an amplifier according to the method of the present invention.

According to the present invention, as shown in the flowchart of FIG. 5, biasing circuit 414 biases amplifier 416 according to the supply voltage available. From a starting point 500, biasing circuit 414 determines whether $V_{CC}$ is within a predetermined voltage range associated with a first supply voltage at step 502. If $V_{CC}$ is within this predetermined voltage range, then, at step 504, biasing circuit 414 will bias amplifier 416 with a first current. A first operating point of amplifier 416 may be represented by an operating point $Q_1$ as shown in FIG. 6. If $V_{CC}$ is not within this predetermined voltage range, then, at step 506, biasing circuit 414 determines whether $V_{CC}$ is within a predetermined voltage range associated with a second supply voltage. If $V_{CC}$ is within this predetermined voltage range, then, at step 508, biasing circuit 414 will bias amplifier 416 with a second current. A second operating point of amplifier 416 may be represented by an operating point $Q_3$ as shown in FIG. 6.

The operating points $Q_1$ and $Q_3$ provide operating characteristics which depend on the biasing current and a load of amplifier 416. In the preferred embodiment, electronic circuit 412 may be designed to provide substantially the same operating characteristics at the first and second operating points. To exemplify, amplifier 416 may be biased to provide a linear operating characteristic (e.g. class A or AB operation) which is maintained during a use of either supply voltage. A gain characteristic of amplifier 416 (gain N) may also be kept substantially the same in the use of the first or the second supply voltage. So although the supply voltage may change for electronic circuit 412, characteristics of the RF signals transmitted by transmitter 308 and used in communication system 300 may be substantially preserved without electronic circuit 412 drawing excess current. The operating points $Q_1$ and $Q_3$ of amplifier 416 change with the supply voltage in order to minimize power dissipation. Thus, using electronic circuit 412 in mobile station 304, when compared to using a conventionally-biased amplifier, increases the time to operate mobile station 304 before a full dissipation of its battery.

Figure 7:
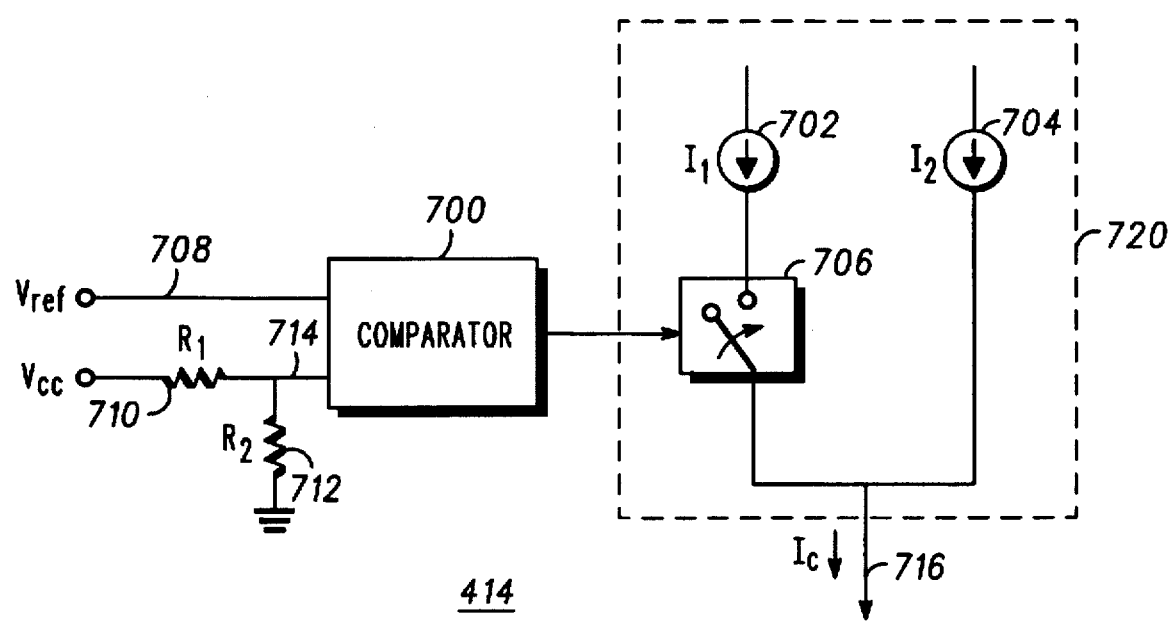
FIG. 7 is a block diagram of the preferred embodiment of a biasing circuit in accordance with the present invention.

FIG. 7 is a block diagram of the preferred embodiment of biasing circuit 414. Biasing circuit 414 comprises a comparator 700 and a variable current source 720. Variable current source 720 includes a current source 702, a current source 704 and a switch 706. Preferably, current sources 702 and 704 are substantially fixed current sources, that is, they do not change substantially with the supply voltage. Comparator 700 has a first input 714 coupled to $V_{CC}$ through a voltage divider comprising a resistor 710 and a resistor 712. Comparator 700 has a second input 708 to which a substantially fixed reference voltage, $V_{REF}$, is supplied. $V_{REF}$ is obtained from a reference voltage circuit (not shown). Comparator 700 controls switch 706 to be open when $V_{CC}$ is within a predetermined voltage range corresponding to a first supply voltage, and closed when $V_{CC}$ is within a predetermined voltage range corresponding to a second supply voltage. $V_{REF}$ remains substantially unchanged whether $V_{CC}$ is the first or second supply voltage.

Amplifier 416 is biased by a current $I_C$ through line 716, coupled to biasing input 413 of amplifier 416 (FIG. 4). Amplifier 416 is also voltage-biased by $V_{CC}$. When the first supply voltage is present, comparator 700 controls switch 706 to be open so that current from current source 704 biases amplifier 416. This establishes a first operating point for amplifier 416. When comparator 700 detects the second supply voltage by comparing voltages $V_{REF}$ and $V_{CC}$, switch 706 is closed and current source 702 is summed with current source 704 to bias amplifier 416 at a second operating point. In the preferred embodiment, the first and second operating points are designed to provide substantially the same operating characteristics.

Figure 8:
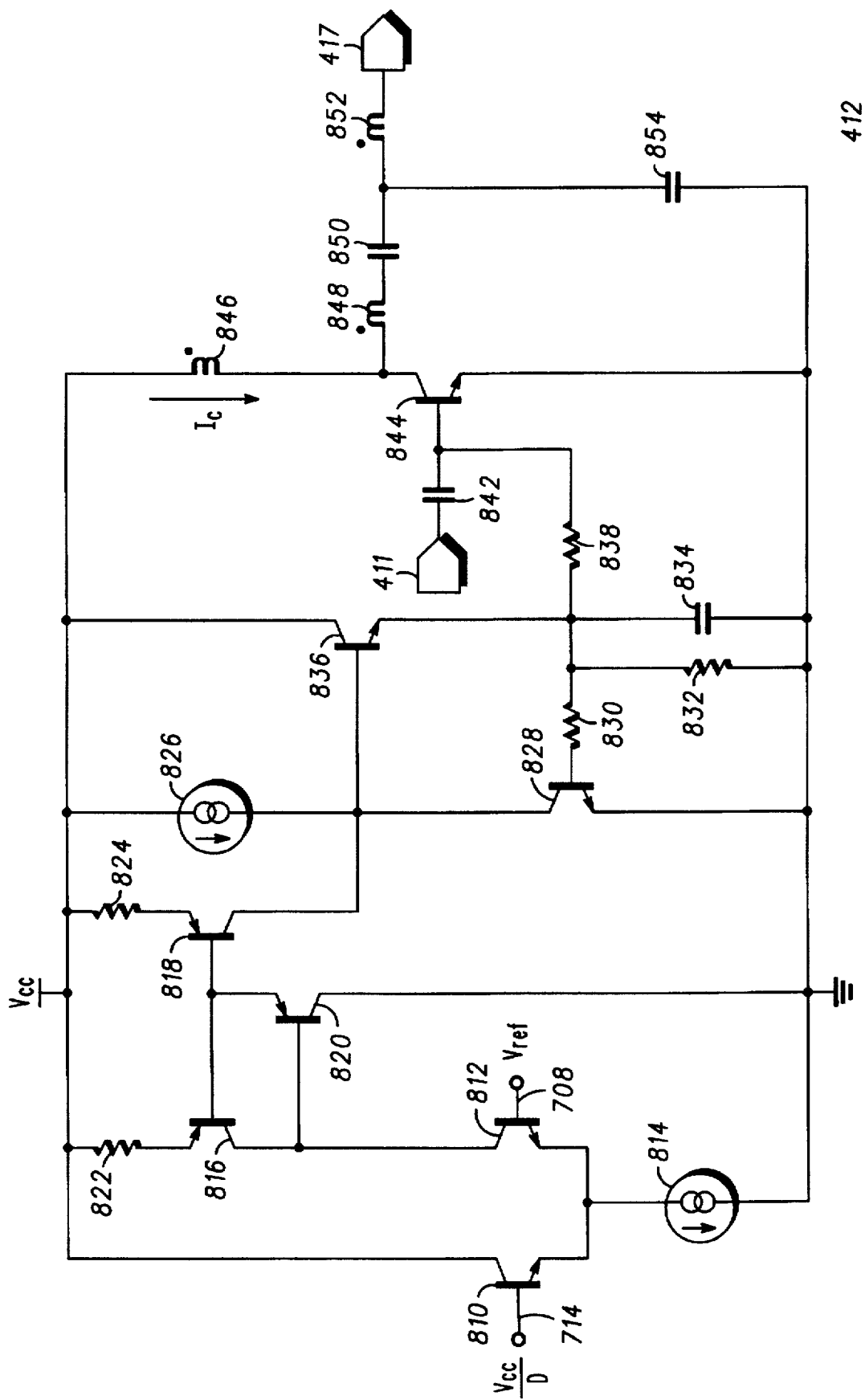
FIG. 8 is a schematic diagram of the preferred embodiment of an electronic circuit in accordance with the present invention.

FIG. 8 shows a schematic diagram of the preferred embodiment of electronic circuit 412. Although bipolar transistors are shown in the preferred embodiment, devices which are functionally equivalent may also be used. An NPN-transistor 810 and an NPN-transistor 812 form a comparator. A base of NPN-transistor 810 is coupled to a voltage equivalent to $V_{CC}/D$, where D is a divisor constant. A base of NPN-transistor 812 is coupled to the reference voltage, $V_{REF}$. A collector of NPN-transistor 810 is coupled to $V_{CC}$, and an emitter of NPN-transistor 810 is coupled to an emitter of NPN-transistor 812 and to a first end of a current source 814. A second end of current source 814 is coupled to a ground reference. A PNP-transistor 816 and a PNP-transistor 818 form a current mirror of electronic circuit 412. An emitter of PNP-transistor 816 is coupled to a first end of a resistor 822 having a second end coupled to $V_{CC}$. An emitter of PNP-transistor 818 is coupled to a first end of a resistor 824 having a second end coupled to $V_{CC}$. A base of PNP-transistor 816 and a base of PNP-transistor 818 are coupled together and also coupled to an emitter of a PNP-transistor 820. A base of PNP-transistor 820 is coupled to a collector of PNP-transistor 816 and to a collector of NPN-transistor 812. A collector of PNP-transistor 820 is coupled to the ground reference. A current source 826 has a first end coupled to $V_{CC}$ and a second end coupled to a collector of PNP-transistor 818, a base of an NPN-transistor 836, and a collector of an NPN-transistor 828. NPN-transistor 828 has an emitter coupled to the ground reference and a base coupled to a first end of a resistor 830. A second end of resistor 830 is coupled to a first end of a resistor 832 having a second end coupled to the ground reference. Second end of resistor 830 is also coupled to a first end of a capacitor 834 having a second end coupled to the ground reference. Second end of resistor 830 is also coupled to an emitter of NPN-transistor 836 and a first end of a resistor 838.

An NPN-transistor 844 is used to amplify signals at amplifier input 411. An inductor 846, an inductor 848, a capacitor 850, a capacitor 854, and an inductor 852 form output matching elements of electronic circuit 412. NPN-transistor 844 has a base coupled to amplifier input 411 through a capacitor 842. Base of NPN-transistor 844 is also coupled to a second end of resistor 838. An emitter of NPN-transistor 844 is coupled to the ground reference, and a collector of NPN-transistor 844 is coupled to $V_{CC}$ through inductor 846. The collector of NPN-transistor 844 is also coupled to a first end of inductor 848 having a second end coupled to a first end of capacitor 850. A second end of capacitor 850 is coupled to a first end of capacitor 854 having a second end coupled to the ground reference. Second end of capacitor 850 is coupled to a first end of inductor 852 having a second end 856 which is coupled to amplifier output 417.

Electronic circuit 412 of FIG. 8 operates in response to a first supply voltage and a second supply voltage, where the first supply voltage is greater than the second supply voltage. When $V_{CC}$ is within a predetermined voltage range corresponding to the first supply voltage, current from current source 814 flows through NPN-transistor 810. Here, NPN-transistor 812, PNP-transistor 816, and PNP-transistor 818 are switched off, and current flowing into NPN-transistor 828 is approximately equivalent to current from current source 826. A current $I_C$ through inductor 846 biases NPN-transistor 844 at a first operating point, and is controlled by current source 826, a ratio of the area of NPN-transistor 844 to the area of NPN-transistor 828, and values of resistors 830 and 838.

When $V_{CC}$ is within a predetermined voltage range corresponding to a second supply voltage, current from current source 814 is switched to flow through NPN-transistor 812 and PNP-transistor 816. Current flowing through PNP-transistor 816 is mirrored through PNP-transistor 818 and summed with current source 826, the total current flowing through NPN-transistor 828. Assuming current sources 814 and 826 do not change with $V_{CC}$, the current $I_C$ increases by the ratio (current source 814+current source 826)/(current source 814)

when $V_{CC}$ is lowered from the first to the second supply voltage. Current sources 814 and 826 and the output matching elements are designed to give similar gain, intermodulation, and output power capacity for the first and second supply voltages. To obtain proper matching (and the same operating characteristics) upon supply voltage changes, the values of the output matching elements should be changed accordingly.

Figure 9:
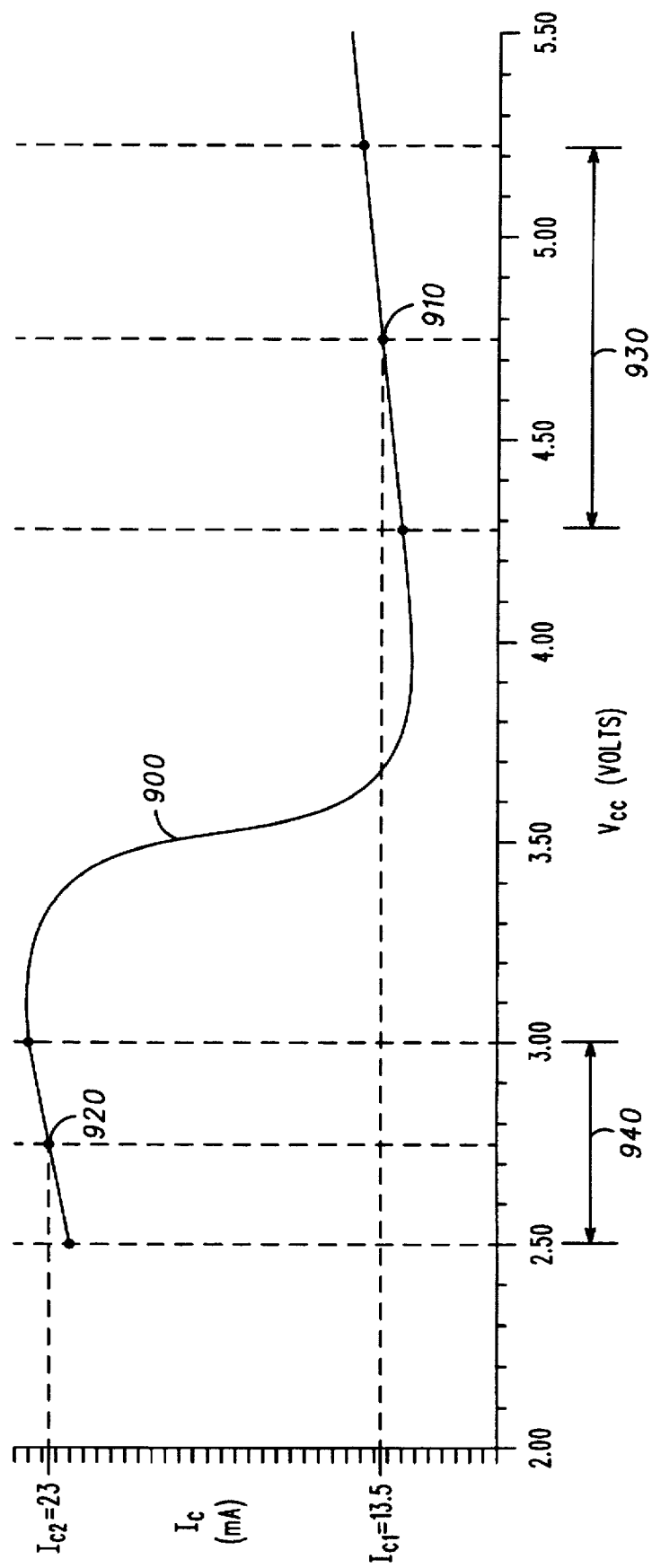
FIG. 9 is a graph of a function showing a relationship between a current $I_C$ and a voltage $V_{CC}$ of the preferred embodiment of FIG. 8.

FIG. 9 is a graph having a function 900 showing a relationship between current $I_C$ and voltage $V_{CC}$ of the preferred embodiment of electronic circuit 412. Function 900 shows a first supply voltage point 910 and a second supply voltage point 920. Biasing circuit 414 is responsive to a predetermined voltage range 930 corresponding to first supply voltage point 910 and a predetermined voltage range 940 corresponding to second supply voltage point 920. When predetermined voltage range 930 is supplied, amplifier 416 is biased at a current of about $I_{C_1}$. When predetermined voltage range 940 is supplied, amplifier 416 is biased at a current of about $I_{C_2}$. Ideally, the currents $I_{C_1}$ and $I_{C_2}$ remain the same over their respective predetermined voltage ranges 930 and 940, but due to non-idealities, each current increases slightly as the supply voltage increases. Thus, function 900 has a curvature which shows that amplifier 416 is biased substantially with a first current when $V_{CC}$ is within predetermined voltage range 930, and biased substantially at a second current when $V_{CC}$ is within predetermined voltage range 940. In the preferred embodiment, the first supply voltage is about 4.75 V, the second supply voltage is about 2.75 V, $I_{C_1}$=13.5 mA, and $I_{C_2}$=23 mA.

$V_{REF}$ may be obtained in many ways. In the preferred embodiment, $V_{REF}$ is about 1.24 V and is obtained by using bandgap reference circuitry, circuitry which is well-known in the art. Also, resistors 710 and 712 are chosen such that a voltage approximately equivalent to $V_{CC}/3$ is present at first input 714.

In the preferred embodiment, electronic circuit 412 is manufactured in an integrated circuit. An IC designed in accordance with FIG. 8 may use standard IC design and manufacturing techniques known in the art. For example, instead of using a single transistor, NPN-transistor 836, a plurality of transistors may be used in its place. In the preferred embodiment of the IC, the output matching elements described in FIG. 8 are not manufactured on the IC and have values which must be changed for proper load matching for each supply voltage. In an alternate embodiment, the IC includes the output matching elements and provides a controlled switching of some or all of their values in response to each supply voltage. An IC including the present invention is advantageous since it is able to provide support for various electronic systems utilizing different supply voltages. Also, it gives an electronic system more flexibility to use lower-voltage technology in the future.

The present invention may be utilized in many different applications and in many different electronic devices. The preferred embodiment demonstrates the use of electronic circuit 412 in transmitter 308 of mobile station 304. However, electronic circuit 412 may also be used in receiver 306 for amplifying received signals, in power amplifier 422 of transmitter 308, or in an audio circuit (not shown) of mobile station 304. Any electronic device including electronic circuit 412 ultimately benefits from the flexibility and reduced power consumption provided by the present invention. A computing device (e.g., a laptop computer) may include a disc drive having a read/write head, a microphone, a speaker, a display, and possibly a touch sensor for the display. Electronic circuit 412 may be used for amplifying many signals in such a device, including data signals read from and written to the read/write head, signals received from the microphone or the touch sensor, signals to drive the display, or audio signals sent to the speaker.

While particular embodiments of the present invention have been shown and described, modifications may be made. For example, although the preferred embodiment shows an electronic circuit which biases an amplifier according to two different supply voltages, an electronic circuit could be designed to bias an amplifier according to three or more supply voltages. It is therefore intended in the appended claims to cover all such changes and modifications which fall within the true spirit and scope of the invention.

What is claimed is:

1. An integrated circuit operable at a supply voltage, said integrated circuit comprising:
   an amplifier; and
   a biasing circuit coupled to said amplifier, said biasing circuit to bias said amplifier with a first current in response to detecting the supply voltage to be within a first predetermined voltage range, said biasing circuit to bias said amplifier with a second current in response to detecting the supply voltage to be within a second predetermined voltage range, the first and the second currents remaining substantially fixed over the first and the second predetermined voltage ranges, respectively.

2. The integrated circuit according to claim 1, wherein the first current is for biasing said amplifier at a first operating point having a first operating characteristic, the second current is for biasing said amplifier at a second operating point having a second operating characteristic, and wherein the first operating characteristic and the second operating characteristic can be made substantially the same by a change in at least one output matching element of a load of said amplifier.

3. The integrated circuit according to claim 1, wherein the first current is for biasing said amplifier at a first operating point having a first gain characteristic, the second current is for biasing said amplifier at a second operating point having a second gain characteristic, and wherein the first gain characteristic and the second gain characteristic can be made substantially the same by a change in at least one output matching element of a load of said amplifier.

4. The integrated circuit according to claim 1, wherein the first and the second currents are for biasing said amplifier for one of class A operation and class AB operation.

5. The integrated circuit according to claim 1, wherein the first predetermined voltage range corresponds to a voltage of about 5 V and the second predetermined voltage range corresponds to a voltage of about 3.3 V.

6. An integrated circuit having a supply voltage input, said integrated circuit comprising:
    an amplifier;
    a biasing circuit including:
        a reference voltage circuit having a reference voltage output, said reference voltage circuit to generate a substantially fixed reference voltage at said reference voltage output;
        a comparator coupled to said supply voltage input and to said reference voltage output;
        a first current source coupled to said amplifier, said first current source for biasing said amplifier with a first substantially fixed current when said supply voltage input is within a first predetermined voltage range; and
        a second current source coupled to said amplifier and responsive to said comparator, said first and said second current sources for biasing said amplifier with a second substantially fixed current when said supply voltage input is within a second predetermined voltage range.

7. An electronic device comprising:
    an electronic circuit including:
        an amplifier; and
        a biasing circuit coupled to said amplifier, said biasing circuit to bias said amplifier with a first operating current over a first predetermined voltage range corresponding to a first supply voltage, said biasing circuit to bias said amplifier with a second operating current over a second predetermined voltage range corresponding to a second supply voltage, the first and the second operating currents remaining substantially fixed over the first and the second predetermined voltage ranges, respectively.

8. The electronic device according to claim 7, wherein said electronic circuit is manufactured in an integrated circuit.

9. The electronic device according to claim 7, wherein the first operating current biases said amplifier at a first operating point having a first operating characteristic, the second operating current biases said amplifier at a second operating point having a second operating characteristic, and wherein the first operating characteristic and the second operating characteristic can be made substantially the same by a change in at least one output matching element of a load of said amplifier.

10. The electronic device according to claim 7, further comprising:
    a battery coupled to said electronic circuit, said battery sourcing the supply voltage of said electronic circuit.

11. The electronic device according to claim 7, wherein said electronic circuit is included in at least one of:
    a receiver of said electronic device;
    a transmitter of said electronic device; and
    an audio circuit of said electronic device.

12. The electronic device according to claim 7, wherein said electronic device comprises a communication device, and wherein said electronic circuit is included within a transmitter of said communication device.

13. A method of biasing an amplifier, the method comprising the steps of:
    biasing the amplifier with a first substantially fixed current over a first operating voltage range of the amplifier; and
    biasing the amplifier with a second substantially fixed current over a second operating voltage range of the amplifier.

14. The method according to claim 13, wherein the step of biasing the amplifier with a second substantially fixed current over a second operating voltage range includes the step of biasing the amplifier with a second substantially fixed current that is greater than the first substantially fixed current and over a second operating voltage range that is less than the first operating voltage range.

15. The method according to claim 14, wherein the step of biasing the amplifier with a first substantially fixed current over a first operating voltage range includes the step of biasing the amplifier with a first substantially fixed current over a first operating voltage range that corresponds to about 5 volts, and wherein the step of biasing the amplifier with a second substantially fixed current over a second operating voltage range includes the step of biasing the amplifier with a second substantially fixed current over a second operating voltage range that corresponds to about 3 volts.

16. The method according to claim 13, wherein the step of biasing the amplifier with a first substantially fixed current over a first operating voltage range includes the step of biasing the amplifier with a first substantially fixed current over a first operating voltage range that includes a range of about 4.25 to 5.25 volts, and wherein the step of biasing the amplifier with a second substantially fixed current over a second operating voltage range includes the step of biasing the amplifier with a second substantially fixed current over a second operating voltage range that includes a range of about 2.5 to 3.0 volts.

17. A method of biasing an amplifier, the amplifier operable at a supply voltage including a first supply voltage and a second supply voltage, the method comprising the steps of:
    generating a reference voltage that is substantially fixed over the first and the second supply voltages;
    comparing the reference voltage and a voltage proportional to the supply voltage;
    detecting, in response to the step of comparing, a first predetermined voltage range corresponding to the first supply voltage;
    detecting, in response to the step of comparing, a second predetermined voltage range corresponding to the second supply voltage;

in response to the step of detecting the first predetermined voltage range, biasing the amplifier with a first current that remains substantially fixed over the first predetermined voltage range; and in response to the step of detecting the second predetermined voltage range, biasing the amplifier with a second current that remains substantially fixed over the second predetermined voltage range.

18. A communication system comprising:

a base station;

a mobile station including:
  an electronic circuit including:
    an amplifier; and
    a biasing circuit coupled to said amplifier, said biasing circuit to operate said amplifier at a first current when a supply voltage of said electronic circuit is within a first predetermined voltage range corresponding to a first supply voltage, said biasing circuit to operate said amplifier at a second current when the supply voltage is within a second predetermined voltage range corresponding to a second supply voltage, the first and the second currents remaining substantially fixed over the first and the second predetermined voltage ranges, respectively.

19. A portable electronic device, comprising:

electronic circuitry to operate at one of a first supply voltage and a second supply voltage;

an integrated circuit having a supply voltage input, said integrated circuit including:
  an amplifier; and
  a biasing circuit coupled to said amplifier, said biasing circuit to bias said amplifier with a first substantially fixed current in response to the supply voltage input being biased within a first predetermined voltage range corresponding to the first supply voltage, said biasing circuit to bias said amplifier with a second substantially fixed current in response to the supply voltage input being biased within a second predetermined voltage range corresponding to the second supply voltage.

20. The portable electronic device according to claim 19, wherein the first supply voltage is greater than the second supply voltage, and wherein the first substantially fixed current is less than the second substantially fixed current.

21. The portable electronic device according to claim 20, wherein the first supply voltage is about 5 volts and the second supply voltage is about 3 volts.

22. An electronic circuit having a supply voltage input, said electronic circuit capable of operating at a first supply voltage and a second supply voltage, the second supply voltage being less than the first supply voltage, said electronic circuit comprising:

an amplifier;

a biasing circuit including:
  a detector to detect a first predetermined voltage range corresponding to the first supply voltage and a second predetermined voltage range corresponding to the second supply voltage; and
  a variable current source coupled to and responsive to said detector, said variable current source to bias said amplifier with a first current over the first predetermined voltage range, said variable current source to bias said amplifier with a second current that is less than the first current over the second predetermined voltage range, the first and the second currents being substantially fixed over the first and the second predetermined voltage ranges, respectively.

23. The electronic circuit according to clam 22, wherein the first supply voltage is about 5 volts and the second supply voltage is about 3.3 volts.

* * * * *